United States Patent
Yamada

(10) Patent No.: US 8,069,427 B2
(45) Date of Patent: Nov. 29, 2011

(54) METHOD AND PROGRAM FOR DESIGNING SEMICONDUCTOR INTEGRATED CIRCUIT USING PERIPHERAL PARAMETER

(75) Inventor: Kenta Yamada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 677 days.

(21) Appl. No.: 12/219,056

(22) Filed: Jul. 15, 2008

(65) Prior Publication Data

US 2009/0024973 A1    Jan. 22, 2009

(30) Foreign Application Priority Data

Jul. 17, 2007   (JP) ................. 2007-185924

(51) Int. Cl.
*G06F 17/50* (2006.01)
(52) U.S. Cl. .............................. 716/113
(58) Field of Classification Search ............. 716/110, 716/111, 112, 113, 136
See application file for complete search history.

(56) References Cited

U.S. PATENT DOCUMENTS

| | | | |
|---|---|---|---|
| 5,847,967 A * | 12/1998 | Asao ............... | 716/115 |
| 6,363,516 B1 * | 3/2002 | Cano et al. ........ | 716/115 |
| 6,953,696 B2 | 10/2005 | Yamauchi | |
| 7,231,626 B2 * | 6/2007 | Hoff et al. ........ | 716/112 |
| 7,360,191 B2 | 4/2008 | Chang et al. | |
| 7,482,671 B2 | 1/2009 | Toda et al. | |
| 2005/0108666 A1 | 5/2005 | Chang et al. | |
| 2005/0132306 A1 | 6/2005 | Smith et al. | |
| 2006/0010409 A1 | 1/2006 | Tamaki et al. | |
| 2006/0142987 A1 | 6/2006 | Ishizu et al. | |
| 2006/0184908 A1 | 8/2006 | Minami et al. | |
| 2007/0026627 A1 | 2/2007 | Kim | |
| 2007/0033558 A1 | 2/2007 | Nakagawa et al. | |
| 2007/0094623 A1 | 4/2007 | Chen et al. | |
| 2007/0132056 A1 | 6/2007 | Williams | |
| 2007/0136705 A1 | 6/2007 | Hosono | |

FOREIGN PATENT DOCUMENTS

| | | |
|---|---|---|
| JP | 2003-23080 | 1/2003 |
| JP | 2006-178907 | 7/2006 |
| JP | 2007-36249 | 2/2007 |

OTHER PUBLICATIONS

Kenta Yamada, USPTO Notice of Allowance, U.S. Appl. No. 12/219,058, filed Nov. 26, 2010, 11 pages.
U.S. Appl. No. 12/219,058, filed Jul. 15, 2008, NEC Electronics Corp.
U.S. Appl. No. 12/219,057, filed Jul. 15, 2008, NEC Electronics Corp.
Kenta Yamada, USPTO, Office Action, U.S. Appl. No. 12/219,057, filed Apr. 4, 2011, 11 pages.

* cited by examiner

*Primary Examiner* — Vuthe Siek
(74) *Attorney, Agent, or Firm* — Foley & Lardner LLP

(57) ABSTRACT

A method of designing a semiconductor integrated circuit includes: performing a circuit simulation of a cell with changing a parameter that specifies a layout pattern around the cell; and generating a delay function expressing a delay value of the cell as a function of the parameter, based on a result of the circuit simulation. The method further includes: generating a layout data indicating a layout of the semiconductor integrated circuit, based on a cell-based design technique. The method further includes: referring to the generated layout data to extract the parameter associated with a target cell included in the semiconductor integrated circuit; and calculating a delay value of the target cell by using the extracted parameter and the delay function.

10 Claims, 13 Drawing Sheets t(PGP_L, PDS_L, ···, NDS_R) = t0     (REFERENCE STATE)
+ Δt(PGP_L)
+ Δt(PDS_L)
⋮
+ Δt(NDS_R)

METHOD AND PROGRAM FOR DESIGNING SEMICONDUCTOR INTEGRATED CIRCUIT USING PERIPHERAL PARAMETER

INCORPORATION BY REFERENCE

This application is based upon and claims the benefit of priority from Japanese patent application No. 2007-185924, filed on Jul. 17, 2007, the disclosure of which is incorporated herein in its entirely by reference.

BACKGROUND OF THE INVENTION

1. Field of the Invention

The present invention relates to a design technique for a semiconductor integrated circuit. In particular, the present invention relates to a design technique in which layout around an element is considered.

2. Description of Related Art

Characteristics of a transistor depend on "device parameters" such as gate length L, gate width W, mobility μ, threshold voltage Vt and the like. When the transistor is actually manufactured, those device parameters are likely to vary from design values. The variations of the device parameters from the design values lead to variations of the transistor characteristics from expected values. It is therefore important to sufficiently consider variation factors of the device parameters at circuit design, verification and manufacturing stages.

For example, a typical variation factor of a gate size (L and W) is OPE (Optical Proximity Effect) in photolithography processes. Due to the OPE, a resist pattern may not be formed as intended, which causes deviations of interconnection width and gate size from the design values. In particular, the variation from the design value caused by the OPE becomes more conspicuous with increasing miniaturization of semiconductor manufacturing processes. Also, the OPE becomes remarkable in a case of a high pattern density. Therefore, OPC (Optical Proximity Correction) is generally performed, in which the OPE is estimated to correct a mask data in advance (refer to US Publication 2007/0033558, for example).

Japanese Laid-Open Patent Application JP-2003-23080 discloses a technique to change a buffer cell depending on cell density in order to obtain a desired chip speed. More specifically, plural types of buffer cells having different driving capability are first prepared, and then driving capability of a buffer cell is changed at a layout design stage depending on the cell density.

Moreover, a layout pattern (or structure) surrounding a transistor can affect device parameters and characteristics of the transistor. Such a peripheral factor affecting the characteristics includes: (1) gate pitch; (2) well proximity effect; and (3) STI stress, for example.

(1) The gate pitch is an interval between a gate of a transistor and a gate of the adjacent transistor. The gate pitch affects, for example, ion dose in an ion injection process. It is known that ON-current becomes larger as the gate pitch becomes smaller while ON-current becomes smaller as the gate pitch becomes larger.

(2) The well proximity effect is described, for example, in Japanese Laid-Open Patent Application JP-2007-36249. More specifically, in a well ion injection process, a part of the injection ions collide with an edge of a resist pattern to be scattered. The scattered ions intrude into an active region of the transistor, which varies the threshold voltage Vt from the design value. This is the well proximity effect. The influence of the well proximity effect becomes larger, as an interval between an edge of the well and an edge of the active region becomes smaller.

(3) The STI stress, which is stress imposed on a transistor from an STI (Shallow Trench Isolation) that is a device isolation structure, affects the mobility μ in a channel (refer to Japanese Laid-Open Patent Application JP-2006-178907) When a width of the STI becomes narrower, the STI stress is increased, and thereby the mobility μ and the ON-current are changed.

As described above, a peripheral pattern (peripheral structure) around a transistor causes variation of the transistor characteristics from the design values. That is to say, the transistor characteristics have "peripheral pattern dependence". If the peripheral pattern is different between transistors, the characteristics of the transistors after manufacturing may become different, even if the transistors have the same design. It is therefore important to consider the peripheral pattern dependence of transistor at the semiconductor integrated circuit design and verification stages.

Japanese Laid-Open Patent Application JP-2006-178907 discloses a method of circuit simulation in which the STI width is considered. According to the circuit simulation, the mobility μ which is one of model parameters of a transistor is corrected depending on the STI width. More specifically, an approximate expression that expresses a relationship between the STI width and the mobility μ is created beforehand based on actually measured values or the like. Prior to the circuit simulation, a designed STI width (design value) is extracted based on the circuit layout. Then, the mobility μ as the model parameter is corrected by using the extracted STI width and the above-mentioned approximate expression. After that, the circuit simulation is performed by using the corrected model parameter. Consequently, the transistor characteristics dependent on the STI width are considered and accuracy of the circuit simulation is improved.

In this context, a tool is commercially available that modulates (corrects) a SPICE netlist used in a SPICE simulation in consideration of the peripheral pattern dependence. The tool is hereinafter referred to as "pattern dependence consideration tool".

FIG. 1 is a schematic diagram for explaining a function of the pattern dependence consideration tool. First, a model (e.g. Δμ=f(X)) that expresses a relationship between graphical information (e.g. STI width X) and modulation amount (e.g. Δμ) of a SPICE model parameter is created through evaluation of TEG (Test Element Group). After that, the SPICE simulation of a cell is performed.

Prior to the SPICE simulation, the pattern dependence consideration tool reads a SPICE netlist (pre-modulation cell netlist) of a target cell and a layout data (cell layout data) of the target cell. Subsequently, the pattern dependence consideration tool extracts the graphical information (X) from the cell layout data, and rewrites (modulates) the SPICE model parameter included in the pre-modulation cell netlist with reference to the above-mentioned model (Δμ=f(X)). As a result, a post-modulation cell netlist that is a SPICE netlist after the rewriting is generated. In the SPICE simulation, the post-modulation cell netlist output from the pattern dependence consideration tool is used. Since the peripheral pattern dependence of transistor is reflected in the SPICE netlist, the simulation accuracy is dramatically improved. It should be noted that the SPICE model parameter to be modulated is not limited to the mobility μ but can include the gate length L, the gate width W, the threshold voltage Vt or the like.

Next, a method of designing and verifying a semiconductor integrated circuit by utilizing the pattern dependence consideration tool will be described with reference to FIG. 2. The pattern dependence consideration tool is used at a cell characterization stage. As mentioned above, the pattern dependence consideration tool rewrites the pre-modulation cell netlist based on the cell layout data to generate the post-modulation cell netlist. After that, the SPICE simulation is performed by using the post-modulation cell netlist, and a delay value (expected value) of the cell is calculated. At this time, a gate size and the like of the transistor are set to corner values in consideration of manufacturing variability. As a result, cell delay values corresponding to the manufacturing variability can be obtained. A corner delay value is extracted from the calculated cell delay values, and a cell delay library that provides the corner delay value is generated. In this manner, the cell characterization is performed.

At the design/verification stage, a placement and routing tool performs cell placement and routing based on a netlist of a design circuit. As a result, a layout data indicating layout of the design circuit is generated. Next, a delay calculation tool reads the netlist, the generated layout data and the above-mentioned cell delay library, and calculates delay values in the design circuit. More specifically, the delay calculation tool calculates delay values of inter-cell interconnections, based on RC extracted from the layout data. The cell delay values (corner delay values) of cells are obtained from the cell delay library. Thus, a delay file indicating the cell delay values and path delay values is generated.

Next, delay verification (timing verification) of the design circuit is performed. More specifically, the STA tool performs an STA (Static Timing Analysis) based on the netlist and the generated delay file. If the verification result is "FAIL", the above-described placement and routing process is performed again to modify the layout data. The same processing is repeated until the verification result becomes "PASS".

With regard to the method shown in FIG. 2, there are the following problems. FIG. 3 is a schematic diagram for explaining the problems, showing one example of a cell layout used at the characterization stage. As an example, let us consider a primitive cell such as a NAND gate, an inverter or the like. The cell shown in FIG. 3 has PMOS transistors P1 to P3 and NMOS transistors N1 to N4 which are formed in a region sandwiched between a power supply line VDD and a ground line GND. The PMOS transistor P1 has diffusion regions PD1 and PD2 that are in contact with an STI. The PMOS transistors P2 has diffusion regions PD3 and PD4 that are in contact with the STI. A distance between diffusion regions of the respective PMOS transistors P1 and P2 that are placed adjacent to each other, namely, a distance X2 between the diffusion regions PD2 and PD3 is the "STI width".

According to the method shown in FIG. 2, the pattern dependence consideration tool extracts the graphical information (e.g. STI width X) from the cell layout data to calculate the modulation amount (e.g. $\Delta\mu$) of the SPICE model parameter. As to the PMOS transistor P2 shown in FIG. 3, the peripheral layout pattern (e.g. STI width X2) is already known and thus the SPICE model parameter can be modulated. As to the PMOS transistor P1 placed at the outermost of the cell, on the contrary, not all peripheral layout pattern is known at the characterization stage where surrounding cells (cells on the left and right sides) are not placed yet. In FIG. 3, for example, an STI width X1 on the left side of the PMOS transistor P1 is not known at the characterization stage but becomes known at the subsequent cell placement process. Therefore, it is not possible to module the SPICE model parameter of the PMOS transistor P1 prior to the SPICE simulation. The same applies to the PMOS transistor P3, the NMOS transistors N1 and N4.

In this manner, with regard to a transistor placed at an inward area of the cell, it is possible by the above-described method to consider the peripheral pattern dependence in the SPICE simulation. However, with regard to the outermost transistor placed near the cell boundary, it is not possible to consider the peripheral pattern dependence in the SPICE simulation since the peripheral layout pattern is unknown. In other words, the peripheral pattern dependence cannot be fully considered at least with respect to the characteristics of the outermost transistor. Since the transistor characteristics affect the cell delay value, it cannot be said that the peripheral pattern dependence is fully considered in the generated cell delay library. Consequently, it cannot be said that the accuracy of the delay verification (STA) is sufficient. This contributes to reduction of yield and reliability of the semiconductor integrated circuit to be manufactured.

In view of the above-described problems, the following two new methods are suggested as alternatives to the method shown in FIG. 2.

According to the first method, types of cells adjacent to a target cell are assumed at the characterization stage for the target cell. The pattern dependence consideration tool modulates the cell netlist based on layout data of the assumed adjacent cells in addition to the cell layout data of the target cell. The resultant post-modulation cell netlist is used in the SPICE simulation so that the cell delay value of the target cell is calculated. The same processing is repeated with setting the adjacent cell type variously (for each of prepared types). As a result, plural kinds of cell delay values corresponding to respective combinations of the adjacent cells are obtained. Then, the cell delay library is generated based on the obtained plural kinds of cell delay values. The peripheral pattern dependence of the outermost transistors in the cell is considered in the generated cell delay library. However, the time (TAT) required for the cell characterization is increased as compared with that in the method shown in FIG. 2.

Furthermore, the first method is disadvantageous in that the corner condition of the cell delay value becomes stricter as compared with that in the method shown in FIG. 2. FIG. 4 schematically shows the corner condition (corner delay value) provided by the cell delay library. According to the method shown in FIG. 2, a delay value distribution corresponding to only the normal manufacturing variability is obtained. According to the first method, on the contrary, the various types of adjacent cells are assumed and thus a plurality of delay value distributions having different center delay values are obtained. Therefore, a variability range of the delay value of each cell is expanded as compared with the case where the adjacent cells are not assumed. That is to say, a "margin" corresponding to the difference of the combination of adjacent cells is further added to the variability range of the delay value of each cell. This means that the corner condition (corner delay value) becomes stricter.

At the circuit design/verification stage, it is necessary to perform the layout design such that the design circuit can operate even in the corner condition. In other words, it is necessary to repeat the layout design and delay verification until the design circuit operates in the corner condition. Therefore, when the corner condition becomes stricter, the number of the repetition times is inevitably increased and thus the time (TAT) required for the circuit design/verification is increased. Moreover, since the margin is added to the cell delay value such that every adjacent cell types can be supported, it is necessary to increase driving capability of transistors and/or to additionally insert redundant cells. This leads to increase in a chip area and power consumption. According to the first method, as described above, the design/verification TAT, chip area and power consumption are increased although the peripheral pattern dependence is fully considered.

According to the second method, the cell characterization is performed as in the case of the method shown in FIG. 2. As a result, the cell delay library in which the peripheral pattern dependence is partially considered is generated. After that, the pattern dependence consideration tool is utilized again at the circuit design/verification stage. More specifically, the pattern dependence consideration tool modulates the SPICE netlist of each cell with reference to the chip-level layout data generated in the placement and routing process. Subsequently, the SPICE simulation of each cell is performed again by using the post-modulation netlist, and a "difference (variation)" from the cell delay value given by the cell delay library is calculated. The calculated difference is reflected in the delay file. In this manner, the peripheral pattern dependence can be considered with regard to the outermost transistor in the cell.

The same processing is repeated for all cells (for example, millions of cells) included in the design circuit. That is to say, the modulation of the SPICE netlist and the SPICE simulation are executed for millions of times at the cell design/verification stage. Thus, the design/verification TAT is increased also in the second method, although the peripheral pattern dependence is fully considered.

According to the related techniques, as described above, while the peripheral pattern dependence is considered, the design/verification TAT is increased. A technique is desired which can prevent the increase in the design/verification TAT for the semiconductor integrated circuit, while considering the peripheral pattern dependence of the transistor characteristics sufficiently.

SUMMARY

In a first aspect of the present invention, a method of designing a semiconductor integrated circuit is provided. The method includes: (A) performing a circuit simulation of a cell with changing a parameter that specifies a layout pattern around the cell; (B) generating a delay function expressing a delay value of the cell as a function of the parameter, based on a result of the circuit simulation; (C) generating a layout data indicating a layout of the semiconductor integrated circuit, based on a cell-based design technique; (D) referring to the generated layout data to extract the parameter associated with a target cell included in the semiconductor integrated circuit; and (E) calculating a delay value of the target cell by using the extracted parameter and the delay function.

In this manner, the parameter (peripheral parameter) related to the peripheral pattern dependence of the transistor characteristics is considered at the cell characterization stage. More specifically, the circuit simulation of the cell is performed by setting the peripheral parameter variously. Furthermore, the delay function expressing the cell delay value as a function of the peripheral parameter is generated based on results of the circuit simulation. At the circuit design/verification stage, the peripheral parameter with regard to a target cell is extracted from the layout data, and a delay value of the target cell is calculated by using the extracted peripheral parameter and the above-mentioned delay function.

Therefore, the peripheral pattern dependence of the transistor characteristics is fully considered. The peripheral pattern dependence is fully considered in calculating the delay value of the target cell. Thus, the accuracy of the delay verification is improved. Consequently, yield and reliability of the semiconductor integrated circuit to be manufactured are also improved.

Moreover, since the above-mentioned delay function is generated at the characterization stage, it is not necessary to repeat the modulation of the SPICE netlist and the SPICE simulation at the circuit design/verification stage. By using the chip-level layout data and the delay function, it is possible to immediately calculate the cell delay value with considering the peripheral pattern dependence. Therefore, increase in the design/verification TAT can be prevented.

Furthermore, the margin such as shown in FIG. 4 is not added to the delay value of each cell which is calculated based on the chip-level layout data and the delay function. Although a center value of the calculated cell delay value may vary from the normal one, the variability range is the same as the normal one. As a result, the number of repetition times of the layout design and delay verification is prevented from being increased. Therefore, the increase in the design/verification TAT can be prevented. Moreover, it is not necessary to increase driving capability of transistors and/or to additionally insert redundant cells. Therefore, the increase in the chip area and power consumption can be prevented.

In a second aspect of the present invention, a design program recorded on a computer-readable medium is provided. When executed, the design program causes a computer to perform a method of designing a semiconductor integrated circuit. The method includes: (A) performing a circuit simulation of a cell with changing a parameter that specifies a layout pattern around the cell; (B) generating a delay function expressing a delay value of the cell as a function of the parameter, based on a result of the circuit simulation; (C) generating a layout data indicating a layout of the semiconductor integrated circuit, based on a cell-based design technique; (D) referring to the generated layout data to extract the parameter associated with a target cell included in the semiconductor integrated circuit; and (E) calculating a delay value of the target cell by using the extracted parameter and the delay function.

In a third aspect of the present invention, a delay calculation program recorded on a computer-readable medium is provided. When executed, the delay calculation program causes a computer to perform a method of calculating a delay value of a cell based on a layout data of a semiconductor integrated circuit. The method includes: (a) reading a delay library from a memory device, wherein the delay library provides a delay function expressing a delay value of a cell as a function of a parameter that specifies a layout pattern around the cell; (b) referring to the layout data to extract the parameter associated with a target cell included in the semiconductor integrated circuit; and (c) calculating a delay value of the target cell by using the extracted parameter and the delay function.

According to the present invention, it is possible to prevent the increase in the design/verification TAT for the semiconductor integrated circuit, while considering the peripheral pattern dependence of the transistor characteristics sufficiently.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Outline

According to the present embodiment, the peripheral pattern dependence of the transistor characteristics is considered. In particular, a layout pattern around a cell is considered at the time of characterization of the cell. The layout pattern around a cell is referred to as "peripheral pattern". The peripheral pattern affects characteristics of a transistor placed at the outermost in the cell.

Figure 5:
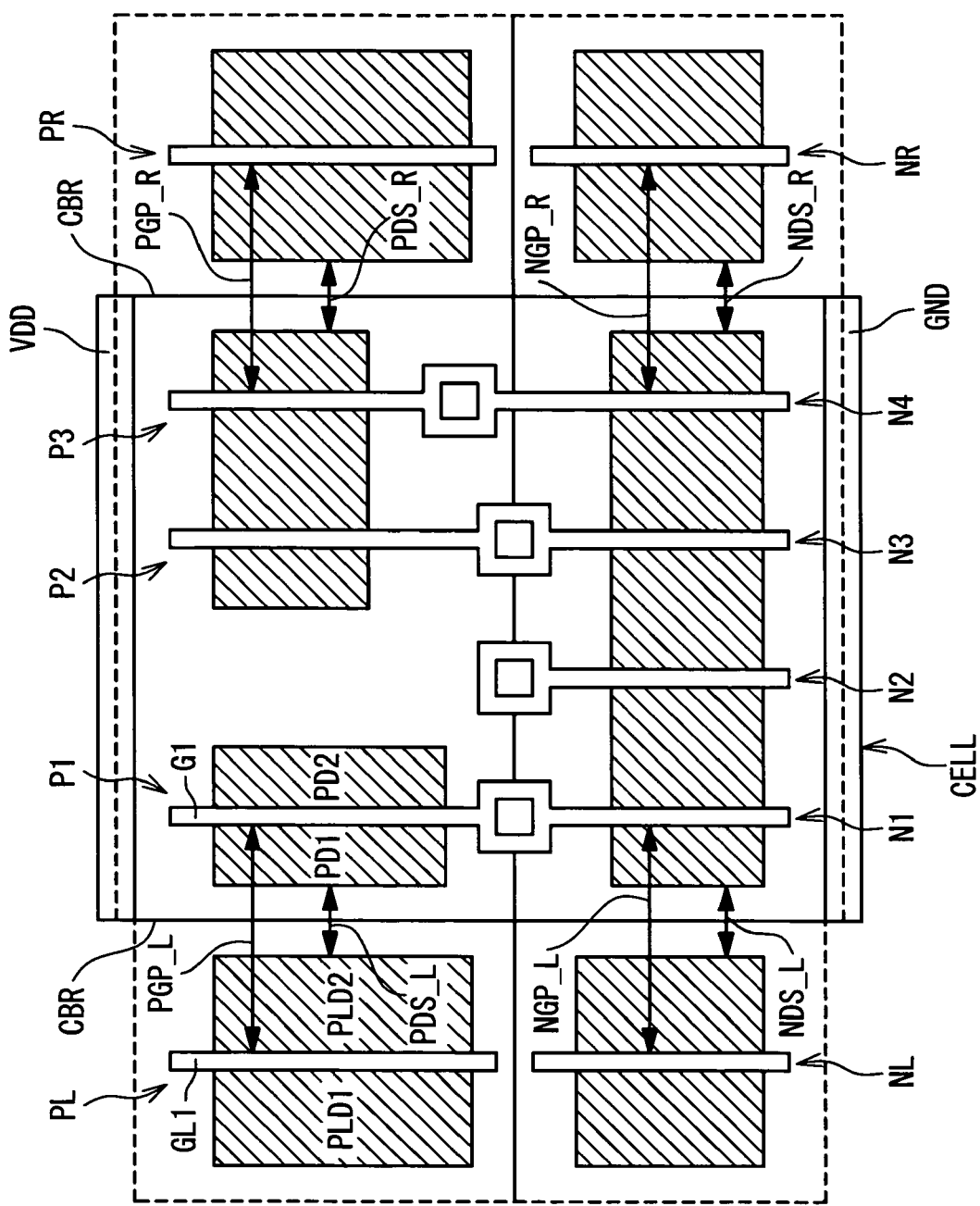
FIG. 5 is a plan view for explaining a peripheral pattern of a cell that is considered in an embodiment of the present invention.

FIG. 5 is a plan view for explaining the peripheral pattern of a certain cell. As an example, let us consider a primitive cell such as a NAND gate, an inverter or the like. The cell shown in FIG. 5 has PMOS transistors P1 to P3 and NMOS transistors N1 to N4. The PMOS transistors P1 to P3 and the NMOS transistors N1 to N4 are formed in a region sandwiched between a power supply line VDD and a ground line GND. A boundary (cell boundary) between the cell and adjacent cells is expressed by a reference numeral CBR. The PMOS transistors P1 and P3 and the NMOS transistors N1 and N4 are outermost transistors which are placed at the outermost in the cell, namely, near the cell boundary CBR. On the other hand, the PMOS transistor P2 and the NMOS transistors N2 and N3 are placed at an inward area of the cell as compared with the outermost transistors. In other words, each of the PMOS transistor P2, NMOS transistors N2 and N3 is sandwiched by other two transistors within the cell.

In order to consider the peripheral pattern dependence of the transistor characteristics, "gate pitch" and "STI width (inter-diffusion-region distance)" are considered for example. The gate pitch is an interval between a gate of a transistor and a gate of the adjacent transistor. The STI width is a width of an STI as a device isolation structure, and is equivalent to a distance (inter-diffusion-region distance) between diffusion regions of adjacent transistors. Either the gate pitch or the STI width may be considered instead of both of them.

As to the transistors P2, N2 and N3 placed at the inward area of the cell, all the gate pitch and STI width can be extracted from a layout data of the cell. As to the outermost transistors P1, P3, N1 and N4, on the other hand, not all the gate pitch and STI width can be extracted only from the layout data of the cell. The reason is that the peripheral pattern of the cell is not included in the layout data of the cell. Therefore, layout patterns of peripheral transistors placed around the cell are supposed (assumed) at the time of characterization of the cell according to the present embodiment. In the example shown in FIG. 5, PMOS transistors PL and PR and NMOS transistors NL and NR are supposed to be placed around the cell.

For example, the PMOS transistor PL, which is one of the peripheral transistors, is supposed to be placed adjacent to the PMOS transistor P1 across the cell boundary CBR. That is, the PMOS transistor P1 (first transistor) within the cell and the PMOS transistor PL (second transistor) outside the cell face each other across the cell boundary CBR. The PMOS transistor P1 has a gate G1 and diffusion regions PD1 and PD2 being in contact with the STI. On the other hand, the PMOS transistor PL has a gate GL1 and diffusion regions PLD1 and PLD2 being in contact with the STI.

In this case, a gate pitch PGP_L is an interval between the gate G1 of the PMOS transistor P1 and the gate GL1 of the PMOS transistor PL. An inter-diffusion-region distance PDS_L is a distance between the diffusion region PD1 of the PMOS transistor P1 and the diffusion region PLD2 of the PMOS transistor PL. The inter-diffusion-region distance PDS_L is equivalent to a with of the STI between the PMOS transistor P1 and the PMOS transistor PL. The gate pitch PGP_L and the STI width PDS_L specify the layout pattern (peripheral pattern) around the cell. In other words, the gate pitch PGP_L and the STI width PDS_L specify a relative position of a layout pattern of the peripheral transistor PL with respect to a layout pattern of the PMOS transistor P1. Such a parameter (PGP_L, PDS_L) specifying the peripheral pattern is referred to as a "peripheral parameter" hereinafter. The peripheral parameters PGP_L and PDS_L affect characteristics of the PMOS transistor P1 within the cell.

Similarly, the PMOS transistor P3 within the cell and the PMOS transistor PR outside the cell are adjacent to each other across the cell boundary CBR. A gate pitch PGP_R and an STI width PDS_R can be defined based on respective layout patterns of the PMOS transistor P3 and the PMOS transistor PR. The gate pitch PGP_R and the STI width PDS_R are peripheral parameters specifying a relative position of the layout pattern of the peripheral transistor PR. The peripheral parameters PGP_R and PDS_R affect characteristics of the PMOS transistor P3 within the cell.

Similarly, the NMOS transistor N1 within the cell and the NMOS transistor NL outside the cell are adjacent to each other across the cell boundary CBR. A gate pitch NGP_L and an STI width NDS_L can be defined based on respective layout patterns of the NMOS transistor N1 and the NMOS transistor NL. The gate pitch NGP_L and the STI width NDS_L are peripheral parameters specifying a relative position of the layout pattern of the peripheral transistor NL. The peripheral parameters NGP_L and NDS_L affect characteristics of the NMOS transistor N1 within the cell.

Similarly, the NMOS transistor N4 within the cell and the NMOS transistor NR outside the cell are adjacent to each other across the cell boundary CBR. A gate pitch NGP_R and an STI width NDS_R can be defined based on respective layout patterns of the NMOS transistor N4 and the NMOS transistor NR. The gate pitch NGP_R and the STI width NDS_R are peripheral parameters specifying a relative position of the layout pattern of the peripheral transistor NR. The peripheral parameters NGP_R and NDS_R affect characteristics of the NMOS transistor N4 within the cell.

As described above, the peripheral parameter specifies a relationship between the layout pattern of the cell and the peripheral pattern. The peripheral parameter affects electrical characteristics of the cell. In the present embodiment, plural kinds of the peripheral parameters are considered. For example, the foregoing eight kinds of peripheral parameters PGP_L, PDS_L, PGP_R, PDS_R, NGP_L, NDS_L, NGP_R and NDS_R are considered (2(Nch and Pch)*2(right and left)*2(gate pitch and STI width)=8 kinds). By setting these peripheral parameters to various values, it is possible to consider various peripheral patterns.

Figure 6:
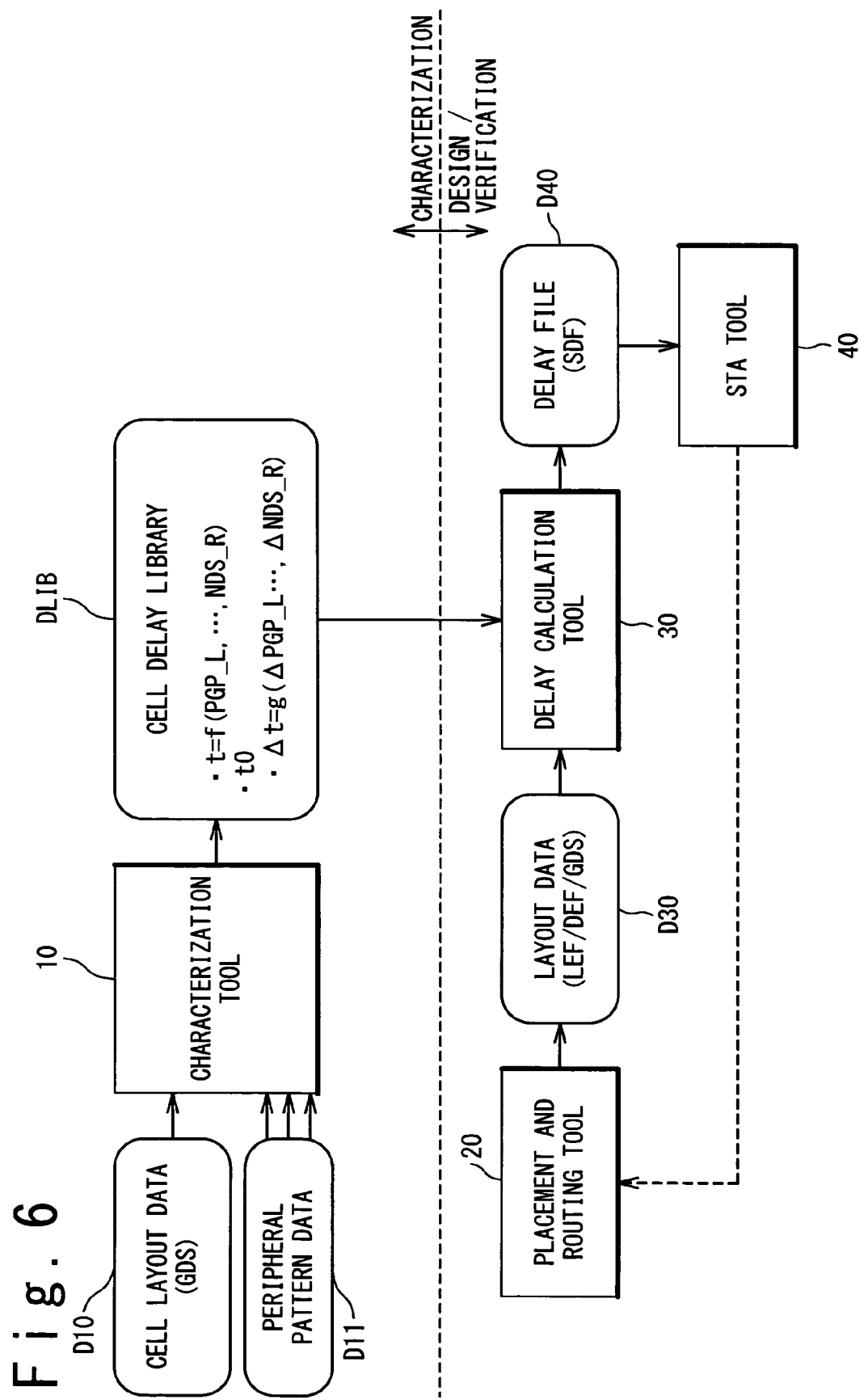
FIG. 6 is a block diagram showing a design flow of a semiconductor integrated circuit according to the embodiment of the present invention.

FIG. 6 schematically shows a design flow for a semiconductor integrated circuit according to the present embodiment. The design flow is classified into a cell characterization stage and a circuit design/verification stage.

At the cell characterization stage, a cell delay library DLIB that provides information related to a cell delay value is generated. According to the present embodiment, the cell delay library DLIB provides a function (delay function) that expresses a relationship between the "cell delay value" and the "peripheral parameters". The delay function may be given by a mathematical formula or may be given in a table form. What is important is that the cell delay value is expressed as a function of the above-mentioned peripheral parameters (PGP_L, PDS_L, PGP_R, PDS_R, NGP_L, NDS_L, NGP_R, NDS_R).

As will be described in detail in the later Section 2, values provided by the cell delay library DLIB may include a cell delay value t, a reference delay value t0 that is a base value of the cell delay value, variation amount $\Delta t$ ($=t-t0$) of the cell delay value t from the reference delay value t0, and the like. The cell delay value t can be expressed as a function of the peripheral parameters. The variation amount $\Delta t$ can be expressed as a function of variation amounts of the peripheral parameters from a reference state. It should be noted that the cell delay value t can have a distribution corresponding to the manufacturing variability. In this case, what is expressed as a function of the peripheral parameters is a center value of the distribution. In the following description, the cell delay value t means the center value except as otherwise noted.

In order to express the cell delay value t as a function of the peripheral parameters, various peripheral patterns are assumed and the cell delay values t under conditions of the various peripheral patterns are calculated. To this end, a peripheral pattern data D11 is prepared in addition to a cell layout data D10 indicating the cell layout. The peripheral pattern data D11 gives various peripheral patterns with regard to the cell. More specifically, the peripheral pattern data D11 gives various combinations of the peripheral parameters.

A characterization tool 10 reads the cell layout data D10 and the peripheral pattern data D11. Based on the cell layout data D10 and the peripheral pattern data D11, the characterization tool 10 performs a circuit simulation of the cell in consideration of the peripheral pattern dependence. At this time, the characterization tool 10 refers to the peripheral pattern data D11 and performs the circuit simulation of the cell with changing the peripheral parameters variously. As a result, various cell delay values t at conditions of the various peripheral parameters are calculated. Based on a result of the circuit simulation, the characterization tool 10 can express the cell delay value t as a function of the peripheral parameters. The characterization tool 10 generates the cell delay library DLIB that provides the function (delay function).

Next, at the circuit design/verification stage, a semiconductor integrated circuit (design circuit) is designed based on the cell-based design technique and verification of the design circuit is performed. First, a placement and routing tool 20 performs cell placement and routing based on the cell-based design technique to generate a layout data D30 indicating a layout of the design circuit. At this stage, an actual layout pattern around the cell is determined.

One of verifications of the design circuit is a timing verification (delay verification). First, a delay calculation tool 30 reads the layout data D30 and the above-mentioned cell delay library DLIB. Subsequently, the delay calculation tool 30 refers to the layout data D30 to extract actual peripheral parameters (PGP_L, PDS_L, PGP_R, PDS_R, NGP_L, NDS_L, NGP_R, NDS_R) associated with each cell included in the design circuit.

Further, the delay calculation tool 30 substitutes the extracted peripheral parameters into the delay function given by the cell delay library DLIB, and thereby calculates the delay value t of each cell. Since the actual peripheral parameters and the above-mentioned delay function are used, influence of the peripheral pattern dependence of the outermost transistors of each cell is included in the calculated cell delay value t. In this manner, a delay file D40 indicating the cell delay values and path delay values is generated.

Next, an STA tool 40 performs the STA (Static Timing Analysis) with reference to the generated delay file D40 to perform the timing verification. If the verification result is "FAIL", the above-described placement and routing process is performed again to modify the layout data D30. The same processing is repeated until the verification result becomes "PASS".

According to the present embodiment, as described above, the delay function that expresses the cell delay value t as a function of the peripheral parameters is generated at the cell characterization stage. At the circuit design/verification stage, the actual peripheral parameters associated with a target cell are extracted from the layout data D30, and the delay value t of the target cell is calculated by using the extracted peripheral parameters and the delay function.

Therefore, the peripheral pattern dependence of the transistor characteristics is fully considered. The peripheral pattern dependence is fully considered in calculating the delay value t of the target cell. Thus, the accuracy of the delay verification is improved. Consequently, yield and reliability of the semiconductor integrated circuit to be manufactured are also improved.

Moreover, since the above-mentioned delay function is generated at the characterization stage, it is not necessary to repeat the modulation of the SPICE netlist and the SPICE simulation at the circuit design/verification stage. By using the chip-level layout data D30 and the delay function, it is possible to immediately calculate the cell delay value t with considering the peripheral pattern dependence. Therefore, increase in the design/verification TAT can be prevented.

Figure 4:
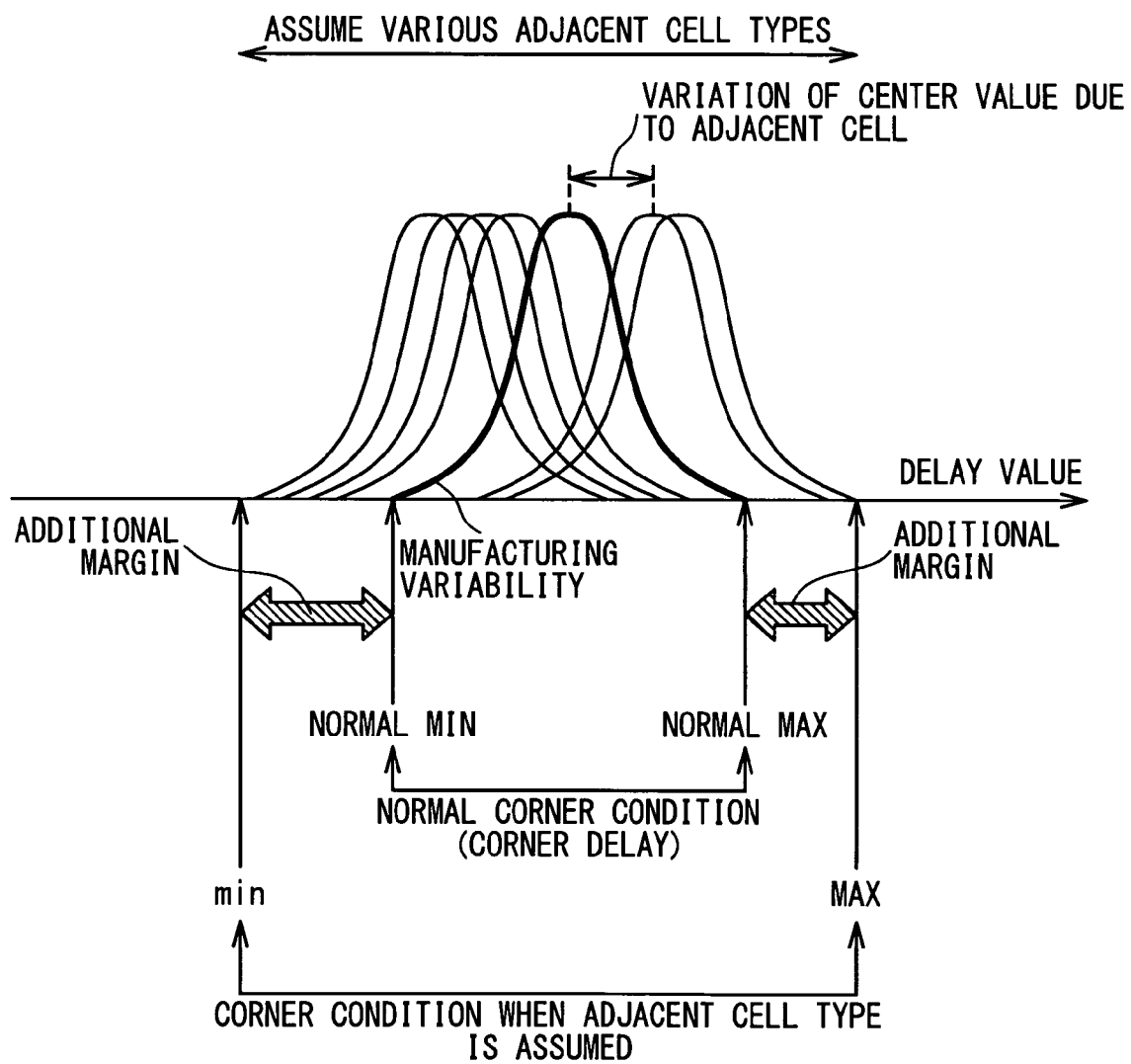
FIG. 4 is a schematic diagram showing corner delay values (corner conditions) provided by a cell delay library.

Furthermore, the margin such as shown in FIG. 4 is not added to the delay value t of each cell which is calculated based on the chip-level layout data D30 and the delay function. Although the calculated cell delay value t (center value) may vary from the normal one, the variability range is the same as the normal one. As a result, the number of repetition times of the layout design and delay verification is prevented from being increased. Therefore, the increase in the design/verification TAT can be prevented. Moreover, it is not necessary to increase driving capability of transistors and/or to additionally insert redundant cells. Therefore, the increase in the chip area and power consumption can be prevented.

The processing according to the present embodiment will be described below in more detail. The cell characterization will be described in the Section 2, and the circuit design/verification will be described in the Section 3.

2. Characterization

Figure 1:
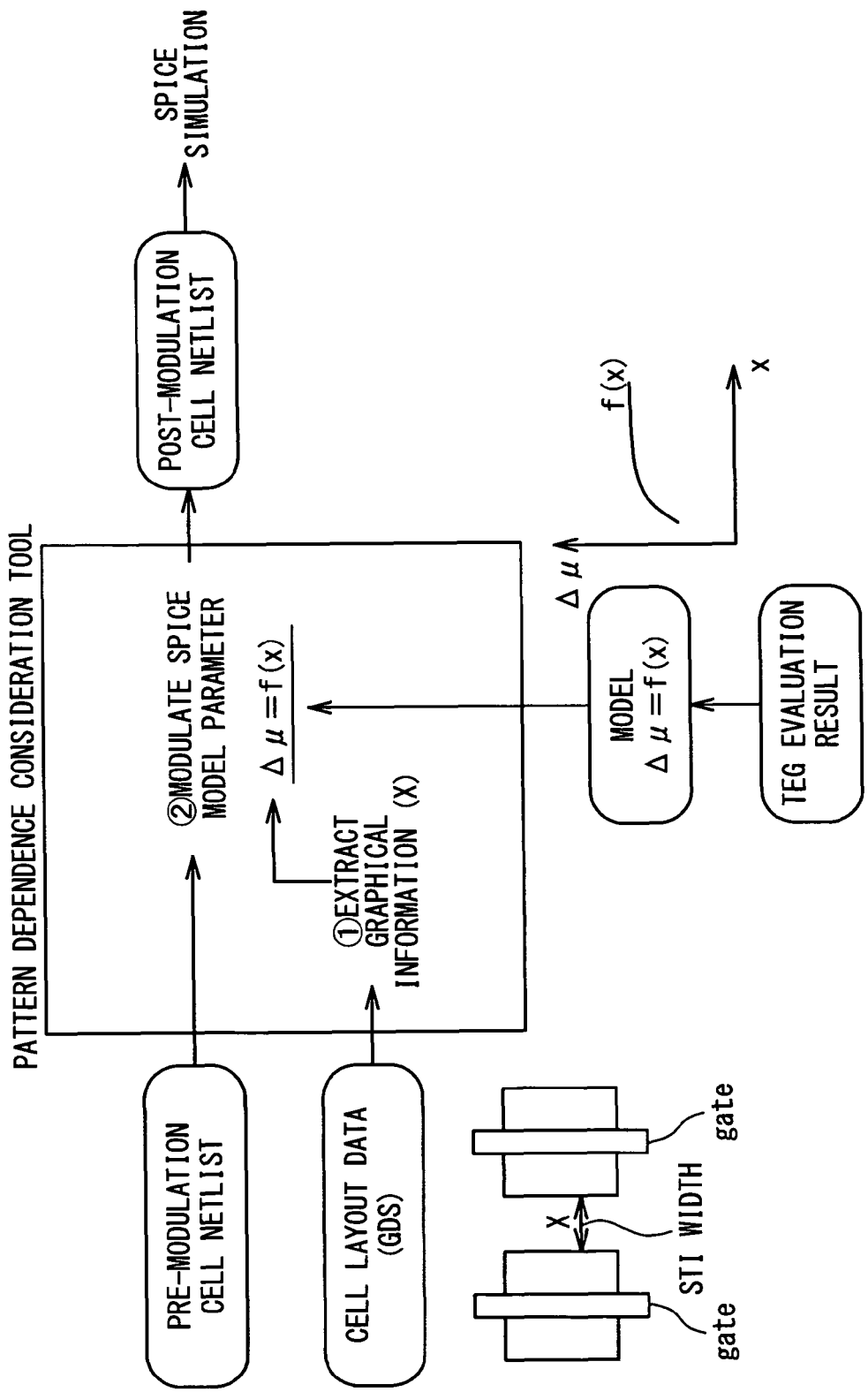
FIG. 1 is a schematic diagram for explaining a function of a pattern dependence consideration tool.
Figure 2:
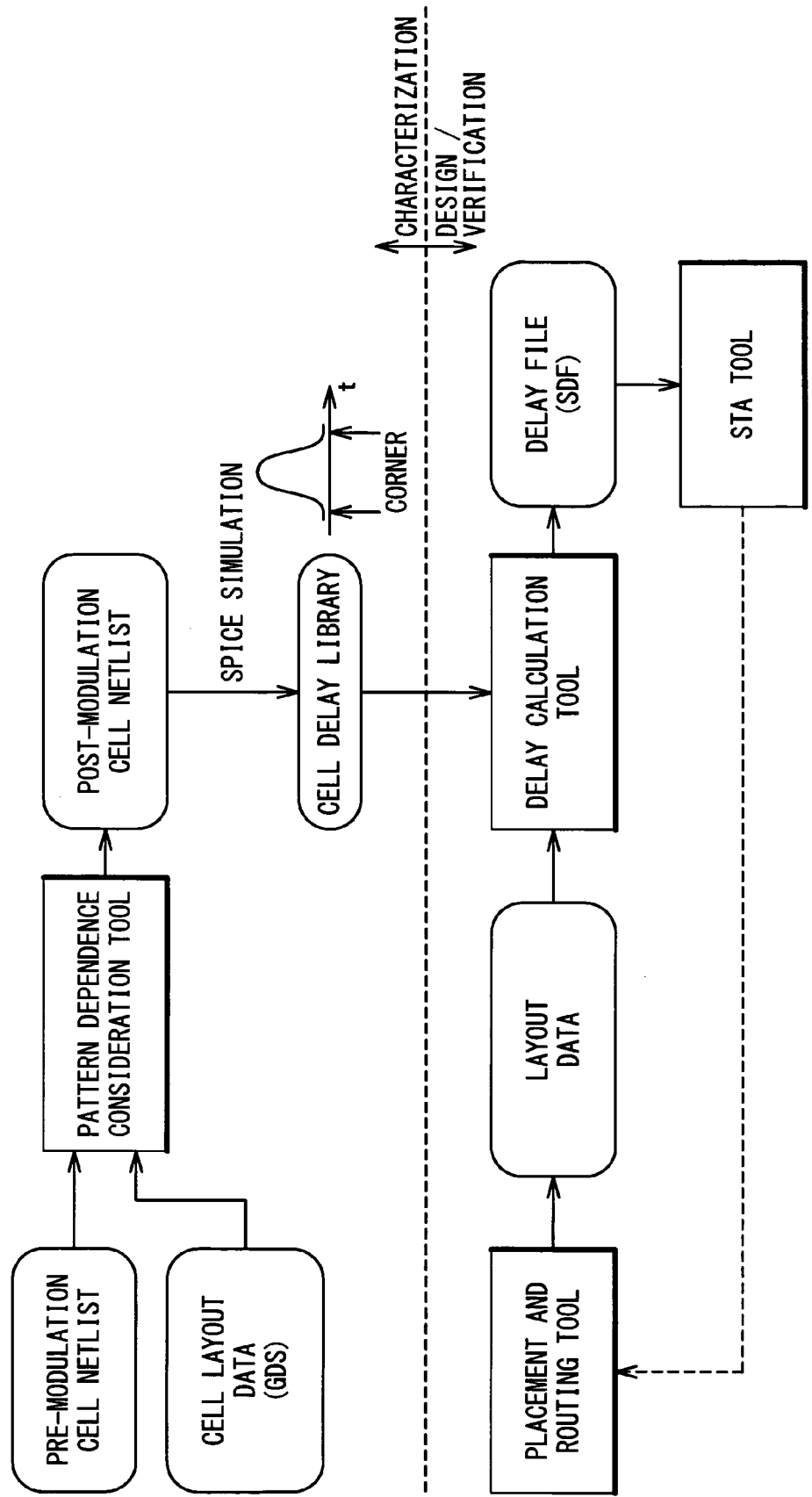
FIG. 2 is a schematic diagram showing a method of designing and verifying a semiconductor integrated circuit by utilizing the pattern dependence consideration tool.
Figure 3:
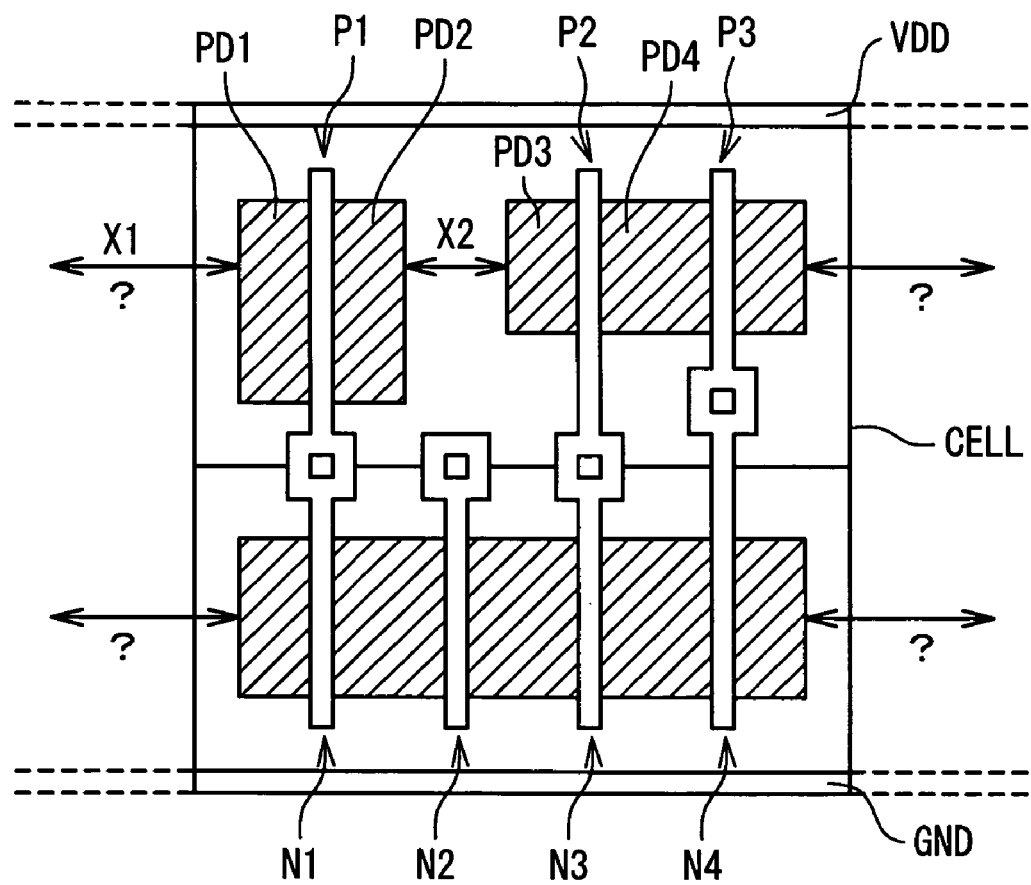
FIG. 3 is a plan view schematically showing one example of a cell layout.
Figure 7:
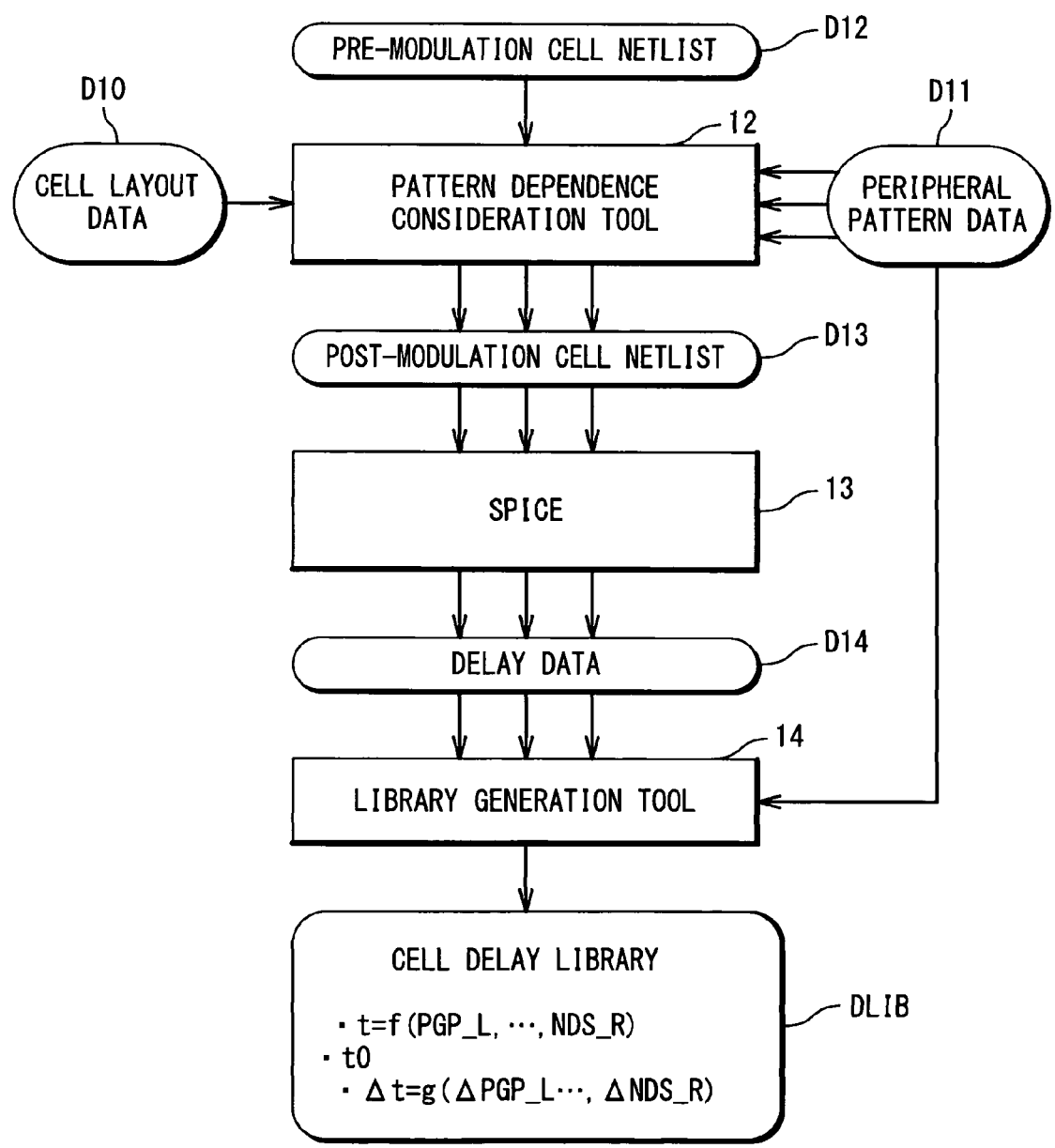
FIG. 7 is a block diagram showing a processing flow of characterization in the embodiment of the present invention.
Figure 8:
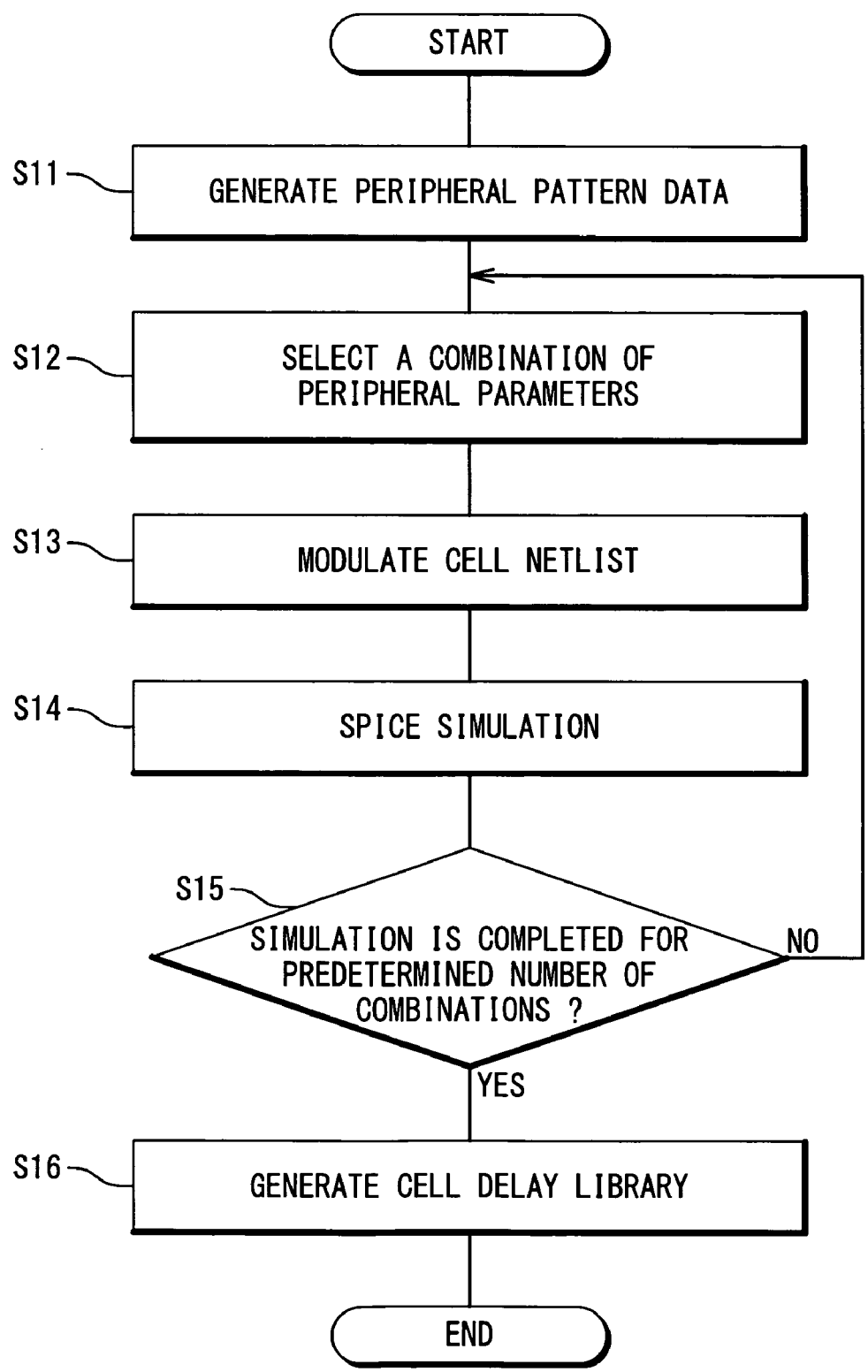
FIG. 8 is a flowchart showing a method of the characterization in the embodiment of the present invention.

FIGS. 7 and 8 are a block diagram and a flowchart showing a processing flow of the characterization, respectively. The processing by the characterization tool 10 will be described in detail with reference to FIGS. 7 and 8. As shown in FIG. 7, the characterization tool 10 includes a pattern dependence consideration tool 12, SPICE 13 and a library generation tool 14, for example. The pattern dependence consideration tool 12 has the same functions as those of the conventional pattern dependence consideration tool shown in FIG. 1.

Step S11:

First, the peripheral pattern data D11 is created by a designer. As described above, the peripheral pattern data D11 gives various combinations of the peripheral parameters (PGP_L, PDS_L, PGP_R, PDS_R, NGP_L, NDS_L, NGP_R and NDS_R). By setting the peripheral parameters to various values, it is possible to consider various peripheral patterns.

For example, a "reference value (base value)" is considered with respect to each of the eight kinds of peripheral parameters. A state in which all the peripheral parameters are respectively set to the reference values is referred to as "reference state" hereinafter. Moreover, n patterns of values (n is a natural number) different from the reference value are considered with respect to each of the eight kinds of peripheral parameters. When a certain peripheral parameter is set to other than the reference value, the other peripheral parameters are set to the respective reference values. That is to say, the peripheral parameter is changed from the reference value one by one. In this case, a total number of combinations of the peripheral parameters is equal to 8*n+1 (reference state). In a case of n=3, for example, 25 combinations of the peripheral parameters can be considered. The peripheral pattern data D11 gives the 25 combinations of the peripheral parameters.

Step S12:

Next, the pattern dependence consideration tool 12 reads the cell layout data D10, the peripheral pattern data D11 and a pre-modulation cell netlist D12. The cell layout data D10 indicates a layout of a cell, whose format is GDS-II for example. The pre-modulation cell netlist D12 is a SPICE netlist of the cell. Then, the pattern dependence consideration tool 12 selects one combination of the peripheral parameters from the peripheral pattern data D11.

Step S13:

Subsequently, the pattern dependence consideration tool 12 modulates the pre-modulation cell netlist D12 based on the cell layout data D10 and the selected combination of the peripheral parameters. The modulation method is similar to that explained in FIG. 1. Specifically, the pattern dependence consideration tool 12 extracts the gate pitches and the STI widths within the cell from the cell layout data D10. Further, the pattern dependence consideration tool 12 combines the extracted parameters and the selected peripheral parameters to rewrite (modulate) the SPICE model parameters included in the pre-modulation cell netlist D12. As a result, a post-modulation cell netlist D13 that is a SPICE netlist after the rewriting is generated.

Step S14:

The post-modulation cell netlist D13 generated by the pattern dependence consideration tool 12 is input to the SPICE (Simulation Program with Integrated Circuit Emphasis) 13. The SPICE 13 performs the SPICE simulation by using the post-modulation cell netlist D13. As a result, a delay value t (expected value) of the cell is calculated. At this time, RC of interconnections and gate sizes of transistors in the cell may be set variously in consideration of the manufacturing variability. In this case, a distribution of the cell delay value t corresponding to the manufacturing variability can be obtained. A delay data D14 indicating the cell delay value t thus calculated is generated.

Step S15:

After that, the processing returns back to the foregoing Step S12, and another combination of the peripheral parameters is selected. Then, another post-modulation cell netlist D13 is generated based on the selected combination (Step S13). Furthermore, the SPICE simulation is performed based on the generated post-modulation cell netlist D13, and thereby another delay data D14 is generated (Step S14). A center value of the cell delay value t indicated by the delay data D14 depends on the selected combination of the peripheral parameters.

In this manner, the processing is repeated with changing the peripheral parameters variously. For example, the processing is repeated for the above-mentioned 25 combinations of the peripheral parameters and thereby 25 kinds of delay data D14 are generated. A cell delay value t calculated under the reference state where all the peripheral parameters are set to the respective reference values is referred to as a "reference delay value t0" hereinafter. The reference delay value t0 is a cell delay value t corresponding to the reference values of the peripheral parameters.

Step S16:

Next, the library generation tool 14 reads the generated delay data D14 and the above-mentioned peripheral pattern data D11. The peripheral pattern data D11 indicates the plural combinations of the peripheral parameters, and the plurality of delay data D14 corresponding to the respective combinations are generated. Therefore, the library generation tool 14 can express the cell delay value t as a function of the peripheral parameters, based on the peripheral pattern data D11 and the delay data D14. The function (delay function) may be given by an approximation formula or may be given in a table form.

For example, the cell delay value t can be modeled with a first-order approximation formula of the peripheral parameters (PGP_L, PDS_L, PGP_R, PDS_R, NGP_L, NDS_L, NGP_R, and NDS_R). Coefficients of the approximation formula can be determined by a fitting processing by the use of the applied peripheral parameters and the calculated cell delay values. The modeled approximation formula is expressed as follows.

$$t = f(PGP\_L, PDS\_L, \ldots, NDS\_R)$$

Alternatively, a variation amount $\Delta t (= t - t0)$ of the cell delay value t from the reference delay value t0 can be modeled. The variation amount (delay variation) $\Delta t$ is expressed as a function of differences ($\Delta PGP\_L$, $\Delta PDS\_L$, $\Delta PGP\_R$, $\Delta PDS\_R$, $\Delta NGP\_L$, $\Delta NDS\_L$, $\Delta NGP\_R$, and $\Delta NDS\_R$) of the peripheral parameters from the respective reference values. The function is referred to as a "delay variation function" hereinafter. As with the above-mentioned approximation formula, the delay variation function is expressed as follows.

$$\Delta t = g(\Delta PGP\_L, \Delta PDS\_L, \ldots, \Delta NDS\_R)$$

A combination of the delay variation function (Δt) and the reference delay value t0 is equivalent to the delay function (t). The delay variation function may be divided for each peripheral parameter. In this case, the delay variation function is expressed as follows.

$$\Delta t1 = g1(\Delta PGP\_L)$$

$$\Delta t2 = g2(\Delta PDS\_L)$$

. . .

$$\Delta t8 = g8(\Delta NDS\_R)$$

$$\Delta t = \Delta t1 + \Delta t2 + \ldots + \Delta t8$$

In this manner, the library generation tool 14 generates the delay function and/or the delay variation function. Moreover, the library generation tool 14 generates the cell delay library DLIB that provides information related to the cell delay value t. For example, the cell delay library DLIB provides the reference delay value t0 and the delay function (t). Alternatively, the cell delay library DLIB provides the reference delay value t0 and the delay variation function (Δt). Alternatively, the cell delay library DLIB may provide only the delay function (t). It should be noted that the cell delay library DLIB is generated for each cell type.

3. Circuit Design/Verification

Figure 9:
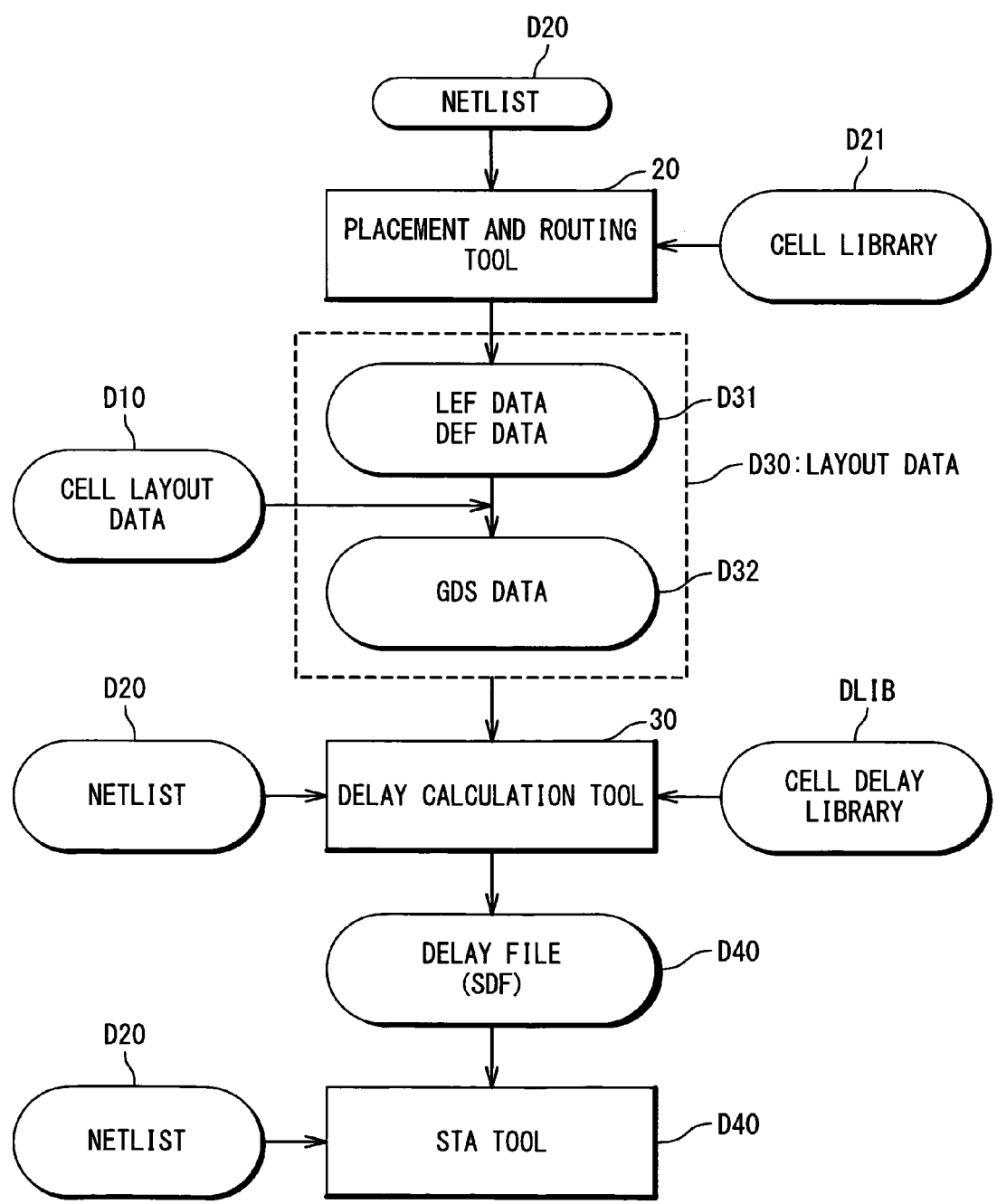
FIG. 9 is a block diagram showing a processing flow of design/verification in the embodiment of the present invention.
Figure 10:
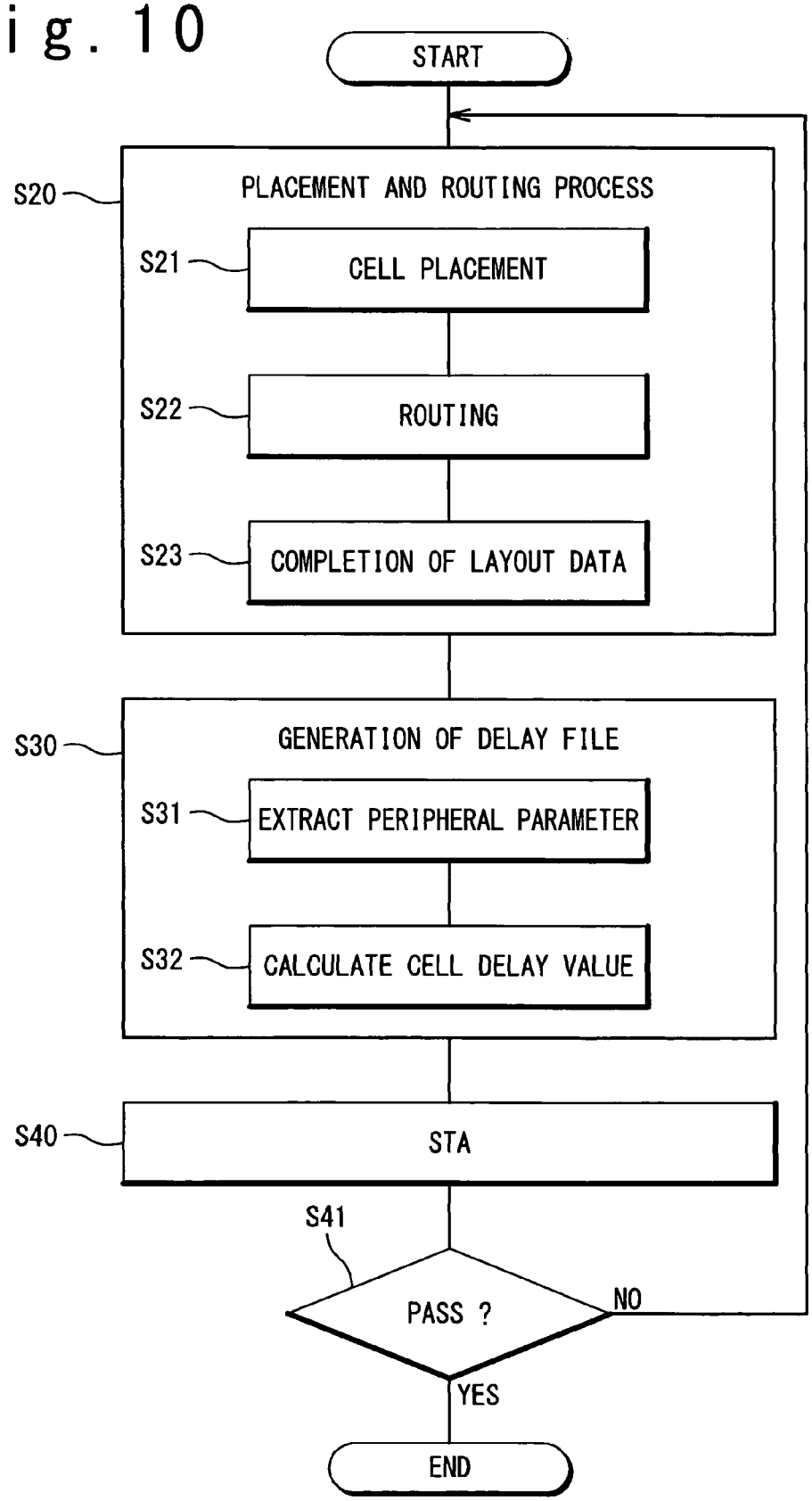
FIG. 10 is a flowchart showing the design/verification method in the embodiment of the present invention.

At the circuit design/verification stage, a semiconductor integrated circuit (design circuit) is designed based on the cell-based design technique and verification of the design circuit is performed. FIGS. 9 and 10 are a block diagram and a flowchart showing a flow of the circuit design/verification processing, respectively. The circuit design/verification processing will be described in detail with reference to FIGS. 9 and 10.

Step S20:

First, the placement and routing tool 20 (layout tool) reads a netlist D20 and a cell library D21. The netlist D20 is a design data indicating connection relationship between cells and the like. The cell library D21 provides various cell data. The placement and routing tool 20 refers to the netlist D20, reads necessary cell data from the cell library D21 and performs the cell placement (Step S21). Moreover, the placement and routing tool 20 performs the routing between the placed cells with reference to the netlist D20 (Step S22).

As a result of the placement and routing, a LEF data (or DEF data) D31 that is placement and routing information of the design circuit is generated. A format of the LEF data is LEF (Layout Exchange Format), and a format of the DEF data is DEF (Design Exchange Format). The LEF/DEF is formats in which terminals and corners of interconnections can be seen while contents of the cells cannot be seen. By combining the LEF data D31 and the above-mentioned cell layout data D10, a GDS data D32 of GDS (Graphic Design System)-II format is generated (Step S23).

In calculating a delay value, the LEF data D31 or the GDS data D32 is used as the layout data D30. It is necessary to extract the gate pitch and the STI width (inter-diffusion-region distance) in calculating the delay value. Therefore, if the LEF data D31 is used, necessary information needs to be added to the LEF data D31 in advance. The information to be added is, for example, a distance from the gate or the diffusion region to the cell boundary.

Step S30:

Next, the delay calculation tool 30 reads the netlist D20, the generated layout data D30 and the above-mentioned cell delay library DLIB from a memory device. Subsequently, the delay calculation tool 30 refers to the layout data D30 to extract actual peripheral parameters (PGP_L, PDS_L, PGP_R, PDS_R, NGP_L, NDS_L, NGP_R and NDS_R) associated with each cell (Step S31).

Furthermore, the delay calculation tool 30 calculates the delay value t of each cell included in the design circuit, by using the extracted actual peripheral parameters and the cell delay library DLIB (Step S32). For example, the delay calculation tool 30 calculates the cell delay value t by substituting the extracted peripheral parameters into the delay function. In a case where the delay function is given by a table form, the cell delay value t can be calculated by interpolating between table values.

Figure 11:
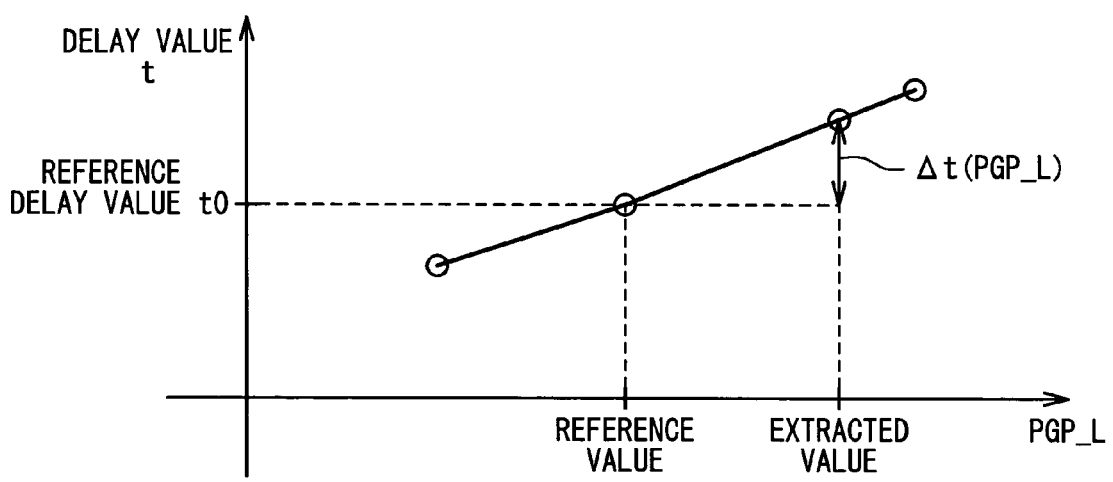
FIG. 11 is a schematic diagram showing one example of calculation of a cell delay value according to the embodiment of the present invention.

FIG. 11 is a schematic diagram for explaining one example of calculation of the cell delay value t. First, the reference delay value t0 corresponding to the reference state is calculated. If the cell delay library DLIB provides the reference delay value t0, the delay calculation tool 30 refers to the cell delay library DLIB to obtain the reference delay value t0. If the cell delay library DLIB provides only the delay function, the delay calculation tool 30 can calculate the reference delay value to by substituting the reference values of the peripheral parameters into the delay function.

Next, the delay calculation tool 30 calculates variation amount (referred to as "delay variation") of the cell delay value t from the reference delay value t0. The delay variation depends on the extracted peripheral parameters. In the present example, the delay variation is calculated for each kind of peripheral parameter. In calculating a delay variation caused by a certain peripheral parameter, only the certain peripheral parameter is set to the extracted value while the other peripheral parameters are set to the respective reference values. This is similar to the processing for creating the above-mentioned peripheral pattern data D11 (refer to Step S11).

For example, let us consider a case where only the peripheral parameter PGP_L is set to the extracted value and the other peripheral parameters are set to the respective reference values. If the cell delay library DLIB provides the delay function (t=f(PGP_L, . . . )), a delay value t(PGP_L) is calculated by substituting the peripheral parameters (the extracted value and the reference values) into the delay function. Subsequently, a delay variation Δt(PGP_L) associated with the peripheral parameter PGP_L is calculated by subtracting the reference delay value t0 from the delay value t(PGP_L).

If the cell delay library DLIB provides the delay variation function (Δt=g(ΔPGP_L, . . . )), a difference ΔPGP_L between the extracted peripheral parameter PGP_L and the reference value is substituted into the delay variation function. The other differences (ΔPDS_L and the like) are zero. As a result, a delay variation Δt(PGP_L) associated with the peripheral parameter PGP_L is calculated.

Other delay variations (Δt(PDS_L) and the like) associated with other peripheral parameters are calculated in a similar manner. As a result, eight kinds of delay variations are calculated in the present example. Then, the delay calculation tool 30 calculates the cell delay value t by adding the eight kinds of delay variations to the reference delay value t0.

In this manner, the delay calculation tool 30 calculates the cell delay value t. If the cell delay value t has a distribution corresponding to the manufacturing variability, the delay calculation tool 30 extracts the cell delay value t (corner delay value) at the corner condition. Moreover, the delay calculation tool 30 calculates delay values of inter-cell interconnections, based on RC extracted from the layout data D30. Thus, the delay file D40 indicating the cell delay values (corner delay values) and path delay values is generated. A format of the delay file D40 is SDF (Standard Delay Format), for example.

Figure 12:
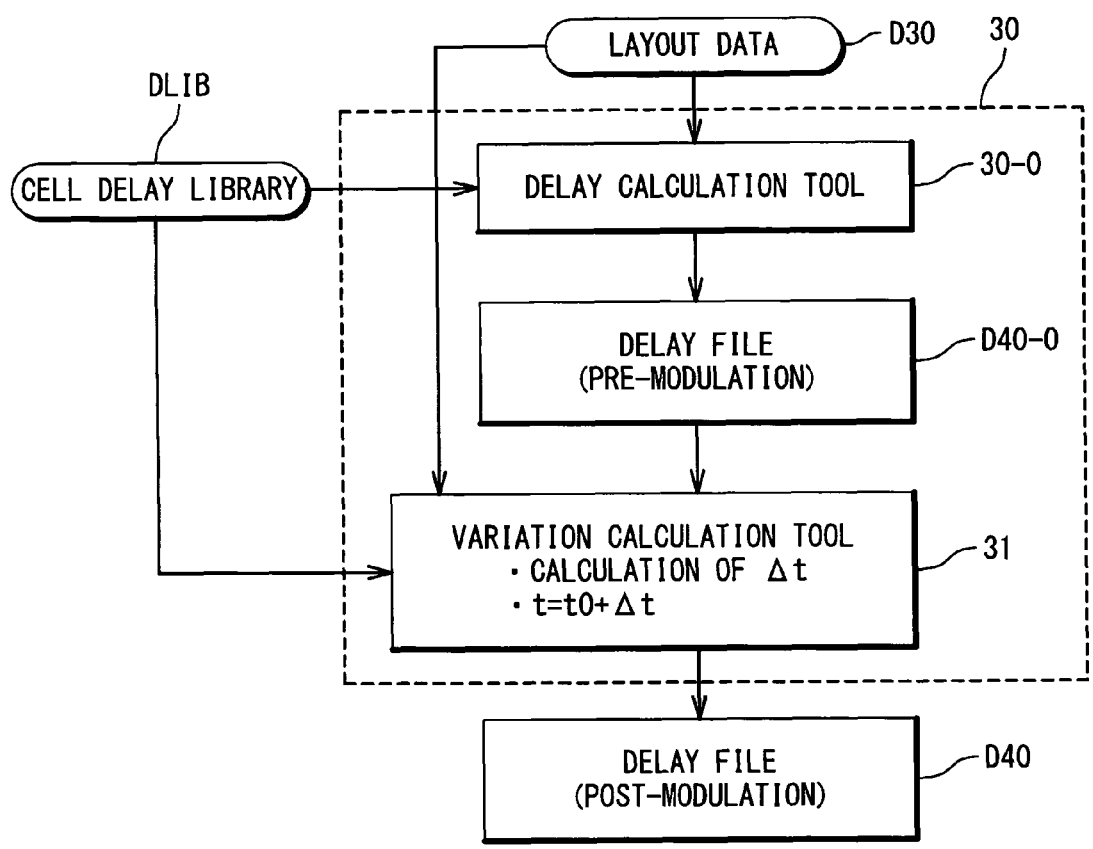
FIG. 12 is a block diagram showing a modification example of a method of generating a delay file in the embodiment of the present invention.

FIG. 12 shows a modification example of the method of generating the delay file D40. In the modification example, the delay calculation tool 30 includes a conventional delay calculation tool 30-0 and a variation calculation tool 31. The delay calculation tool 30-0 generates a delay file D40-0 as usual based on the layout data D30 and the cell delay library DLIB. That is, the delay calculation tool 30-0 refers to only the reference delay value t0 and generates the delay file D40-0 without extracting actual peripheral parameters from the layout data D30. The delay file D40-0 indicates the reference delay value t0 of each cell and the path delay values, in which the peripheral pattern dependence is not considered.

The variation calculation tool 31 calculates the above-mentioned delay variation Δt based on the layout data D30 and the cell delay library DLIB. The calculation method of the delay variation Δt is the same as the above-described method (refer to FIG. 11). Then, the variation calculation tool 31 reads the delay file D40-0 and modulates the delay file D40-0 by using the delay variation Δt. In other words, the variation calculation tool 31 reflects the calculated delay variation Δt in the delay file D40-0 (t=t0+Δt). As a result, the delay file D40 in which the peripheral pattern dependence is considered is generated. The present modification example is preferable in that the processing of the present invention can be easily incorporated into the conventional flow.

Step S40:

Next, the delay verification (timing verification) of the design circuit is performed. More specifically, the STA tool 40 performs the STA based on the netlist D20 and the generated delay file D40. If the verification result is "FAIL" (Step S41; No), the above-described placement and routing process (Step S20) is performed again to modify the layout data D30. The same processing is repeated until the verification result becomes "PASS". When the verification result becomes "PASS" (Step S41; Yes), the delay verification is completed.

According to the present embodiment, high verification accuracy can be achieved since the peripheral pattern dependence is considered. Accordingly, yield and reliability of the semiconductor integrated circuit to be manufactured are improved. Moreover, the margin such as shown in FIG. 4 is not added to the cell delay value t indicated by the delay file D40. Consequently, the number of repetition times of the layout design and delay verification is prevented from being increased. Therefore, the increase in the design/verification TAT can be prevented. Furthermore, it is not necessary to increase driving capability of transistors and/or to additionally insert redundant cells. Therefore, the increase in the chip area and power consumption can be prevented.

4. Design System

Figure 13:
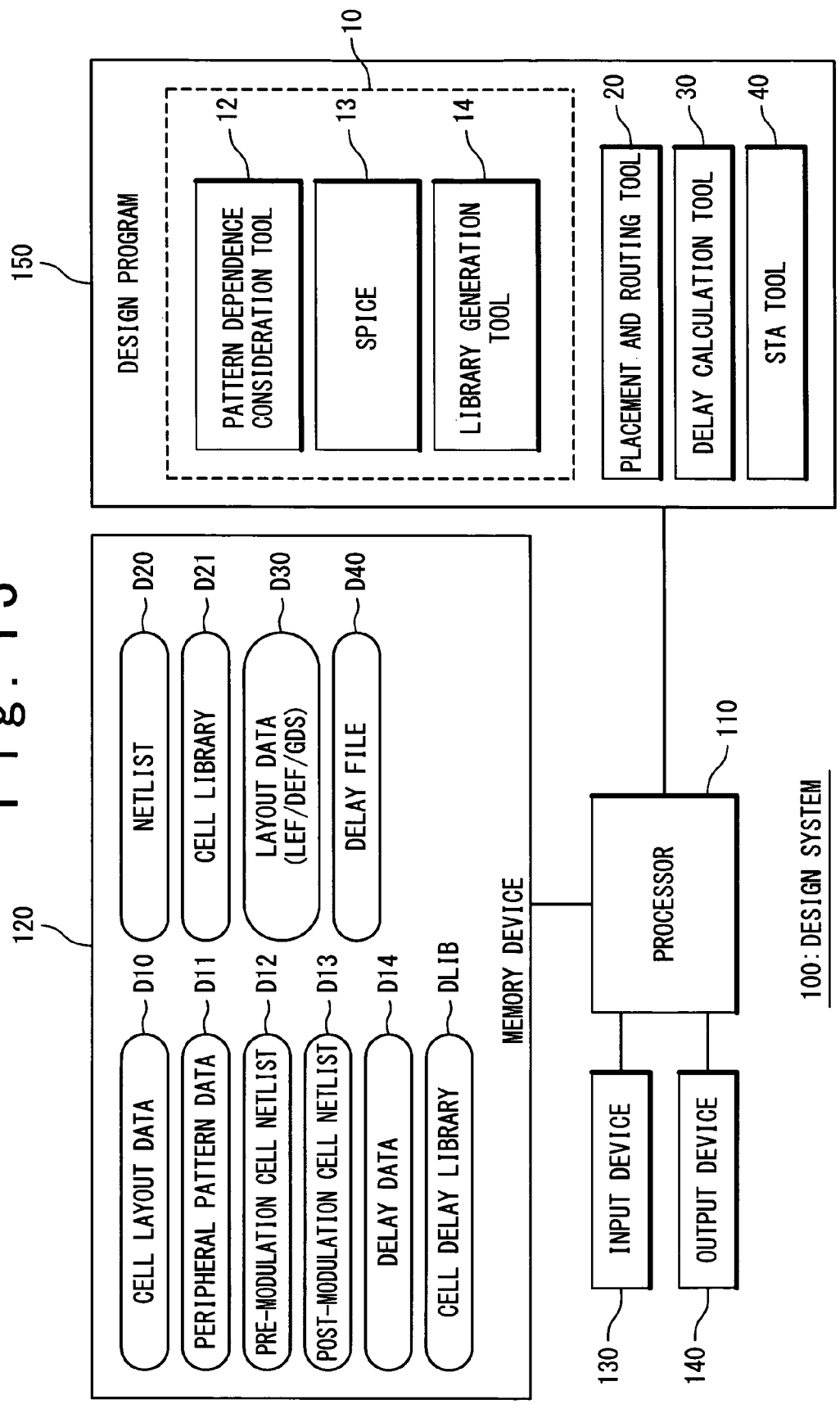
FIG. 13 is a block diagram showing a configuration example of a design system according to the embodiment of the present invention.

The design method for a semiconductor integrated circuit according to the present embodiment can be achieved by a computer system. FIG. 13 is a block diagram showing a configuration example of a design system 100 according to the present embodiment. The design system 100 is provided with a processor 110, a memory device 120, an input device 130, an output device 140 and a design program 150. The memory device 120 includes a RAM and an HDD. The input device 130 includes a key board and a mouse. The output device 140 includes a display.

Stored in the memory device 120 are the cell layout data D10, the peripheral pattern data D11, the pre-modulation cell netlist D12, the post-modulation cell netlist D13, the delay data D14, the cell delay library DLIB, the netlist D20, the cell library D21, the layout data D30, the delay file D40 and so forth.

The design program 150 is software program executed by the processor 110. The design program 150 may be recorded on a computer-readable recording medium. The design program 150 may be stored in the memory device 120. The design program 150 includes the characterization tool 10, the placement and routing tool 20, the delay calculation tool 30, the STA tool 40 and so forth. The characterization tool 10 includes the pattern dependence consideration tool 12, the SPICE 13 and the library generation tool 14.

The processor 110 executes the respective tools of the design program 150 to achieve the data processing. Each tool reads necessary data and files from the memory device 120 and writes generated data and files to the memory device 120. Consequently, the above-mentioned processing according to the present embodiment is achieved.

It is apparent that the present invention is not limited to the above embodiments and may be modified and changed without departing from the scope and spirit of the invention.

What is claimed is:

1. A method of designing a semiconductor integrated circuit comprising:

performing, via a processor, a circuit simulation of a cell with changing a peripheral parameter that specifies a relationship between a layout pattern of said cell and a peripheral pattern around said cell, said peripheral parameter affecting electrical characteristics of said cell;

generating, via the processor, a delay function expressing a delay value of said cell as a function of said peripheral parameter, based on a result of said circuit simulation;

generating, via the processor, a layout data indicating a layout of said semiconductor integrated circuit, based on a cell-based design technique;

referring, via the processor, to said generated layout data to extract said peripheral parameter associated with a target cell included in said semiconductor integrated circuit; and calculating, via the processor, a delay value of said target cell by using said extracted peripheral parameter and said delay function, wherein said cell includes a first transistor placed near a boundary of said cell, wherein a second transistor is supposed to be placed adjacent to said first transistor across said boundary, and said peripheral parameter specifies a relative position of a layout pattern of said second transistor with respect to a layout pattern of said first transistor.

2. The method according to claim 1, wherein said peripheral parameter includes an interval between a gate of said first transistor and a gate of said second transistor.

3. The method according to claim 1, wherein said peripheral parameter includes a width of a device isolation structure between said first transistor and said second transistor.

4. A method of designing a semiconductor integrated circuit comprising:

performing, via a processor, a circuit simulation of a cell with changing a peripheral parameter that specifies a relationship between a layout pattern of said cell and a peripheral pattern around said cell, said peripheral parameter affecting electrical characteristics of said cell;

generating, via the processor, a delay function expressing a delay value of said cell as a function of said peripheral parameter, based on a result of said circuit simulation;

generating, via the processor, a layout data indicating a layout of said semiconductor integrated circuit, based on a cell-based design technique;

referring, via the processor, to said generated layout data to extract said peripheral parameter associated with a target cell included in said semiconductor integrated circuit; and calculating, via the processor, a delay value of said target cell by using said extracted peripheral parameter and said delay function, wherein said performing said circuit simulation includes:

performing said circuit simulation with setting said peripheral parameter to a reference value to calculate a reference delay value that is said delay value corresponding to said reference value; and performing said circuit simulation with changing said peripheral parameter from said reference value to calculate said delay value.

5. The method according to claim 4, wherein said generating said delay function includes:

generating said delay function; and generating a delay library that provides said reference delay value and said delay function.

6. The method according to claim 5, wherein said calculating said delay value of said target cell includes:

obtaining said reference delay value with reference to said delay library;

calculating, by using said extracted peripheral parameter and said delay function, a delay variation that is variation of said delay value from said reference delay value; and calculating said delay value of said target cell by adding said delay variation to said reference delay value.

7. The method according to claim 4, wherein said generating said delay function includes:

generating a delay variation function that expresses variation of said delay value from said reference delay value as a function of a difference of said peripheral parameter from said reference value, wherein said delay function is a combination of said reference delay value and said delay variation function; and generating a delay library that provides said reference delay value and said delay variation function.

8. The method according to claim 7, wherein said calculating said delay value of said target cell includes:

obtaining said reference delay value with reference to said delay library;

calculating, by using a difference of said extracted peripheral parameter from said reference value and said delay variation function, a delay variation that is variation of said delay value from said reference delay value; and calculating said delay value of said target cell by adding said delay variation to said reference delay value.

9. A design program recorded on a non transitory computer-readable medium that, when executed, causes a computer to perform a method of designing a semiconductor integrated circuit, the method comprising:

performing a circuit simulation of a cell with changing a peripheral parameter that specifies a relationship between a layout pattern of said cell and a peripheral pattern around said cell, said peripheral parameter affecting electrical characteristics of said cell;

generating a delay function expressing a delay value of said cell as a function of said peripheral parameter, based on a result of said circuit simulation;

generating a layout data indicating a layout of said semiconductor integrated circuit, based on a cell-based design technique;

referring to said generated layout data to extract said peripheral parameter associated with a target cell included in said semiconductor integrated circuit; and calculating a delay value of said target cell by using said extracted peripheral parameter and said delay function, wherein said cell includes a first transistor placed near a boundary of said cell, wherein a second transistor is supposed to be placed adjacent to said first transistor across said boundary, and said peripheral parameter specifies a relative position of a layout pattern of said second transistor with respect to a layout pattern of said first transistor.

10. A delay calculation program recorded on a non transistory computer-readable medium that, when executed, causes a computer to perform a method of calculating a delay value of a cell based on a layout data of a semiconductor integrated circuit, the method comprising:

reading a delay library from a memory device, wherein said delay library provides a delay function expressing a delay value of a cell as a function of a peripheral parameter that specifies a relationship between a layout pattern of said cell and a peripheral pattern around said cell, said peripheral parameter affecting electrical characteristics of said cell;

referring to said layout data to extract said peripheral parameter associated with a target cell included in said semiconductor integrated circuit; and calculating a delay value of said target cell by using said extracted peripheral parameter and said delay function, wherein said cell includes a first transistor placed near a boundary of said cell, wherein a second transistor is supposed to be placed adjacent to said first transistor across said boundary, and said peripheral parameter specifics a relative position of a layout pattern of said second transistor with respect to a layout pattern of said first transistor.

* * * * *